United States Patent [19]

Needes et al.

[11] 4,255,291

[45] Mar. 10, 1981

[54] AIR-FIREABLE CONDUCTOR COMPOSITION

[75] Inventors: Christopher R. S. Needes; Joseph R. Rellick, both of Newark, Del.

[73] Assignee: E. I. Du Pont de Nemours and Company, Wilmington, Del.

[21] Appl. No.: 50,611

[22] Filed: Jun. 21, 1979

[51] Int. Cl.³ .............................................. H01B 1/06
[52] U.S. Cl. .................................... 252/578; 428/430; 428/433; 428/427; 428/428; 313/218; 252/512; 106/1.13; 106/1.18; 106/1.26; 428/901
[58] Field of Search .................... 252/512, 518; 106/5, 106/4, 1.13, 1.18, 1.26, 1; 428/427, 428, 432, 901, 433; 313/218

[56] References Cited

U.S. PATENT DOCUMENTS

| | | | |
|---|---|---|---|
| 3,943,168 | 3/1976 | Patterson | 252/519 |
| 4,064,310 | 12/1977 | Patterson | 428/427 |
| 4,122,232 | 10/1978 | Kuo | 252/518 |
| 4,130,671 | 12/1978 | Nagesh et al. | 252/518 |
| 4,148,761 | 4/1979 | Kajmerowicz | 252/512 |

FOREIGN PATENT DOCUMENTS 2803926  8/1978  Fed. Rep. of Germany ........... 252/518

OTHER PUBLICATIONS

"Handbook of Materials and Processes for Electronics", C. A. Harper, Editor, McGraw-Hill.

*Primary Examiner*—Benjamin R. Padgett
*Assistant Examiner*—J. L. Barr

[57] ABSTRACT

Air-fireable thick film conductor compositions are provided. The conductor composition is a paste containing (1) an inorganic powder made from an intermetallic phase copper-aluminum powder, aluminum powder and a glass frit and (2) an inert organic liquid vehicle.

13 Claims, No Drawings

AIR-FIREABLE CONDUCTOR COMPOSITION

DESCRIPTION

TECHNICAL FIELD

This invention relates to thick film conductor compositions. More particularly, it relates to conductor pastes containing an intermetallic phase of copper-aluminum powder, aluminum powder, a glass frit and an inert organic liquid vehicle useful for producing conductor patterns adherent to substrates.

BACKGROUND ART

Conductor compositions applied to and fired on dielectric substrates (glass, glass-ceramic, and ceramic) usually comprise finely divided inorganic powders (e.g., metal particles and binder particles) and are commonly applied to substrates using so-called "thick-film" techniques as a dispersion of inorganic powders in an inert organic liquid medium or vehicle. Upon firing or sintering of the printed film, the metallic component of the composition provides the functional (conductive) utility while the inorganic binder (for example, glass, $B_2O_3$, etc.) bonds the metal particles to one another and to the substrate. Thick film techniques are contrasted with thin film techniques involving deposition of particles by evaporation or sputtering. Thick film techniques are discussed in "Handbook of Materials and Processes for Electronics", C. A. Harper, editor, McGraw-Hill, New York, 1970, Chapter 12.

The most commonly used conductor compositions employ noble metals, especially gold, silver, platinum, palladium, and their mixtures, alloys and compounds, since their relatively inert characteristics permit firing in air. Attempts at using dispersions of less expensive non-noble metals have often been confined to specialized uses or have required the great practical inconvenience and expense of firing in nonoxidizing atmospheres (nitrogen, nitrogen/hydrogen, hydrogen, argon, etc.).

There is a distinct commerical need for less expensive conductor compositions which can be fired in air to produce adherent low resistivity conductors on dielectric substrates.

In particular there is a need for a composition that can be used as the busbar to the tin oxide anode of a DC-gas discharge display. Such a composition should be inexpensive, fireable in air, physically and chemically compatible with plain and tin oxide coated soda lime glass, exhibit good adhesion and yield good humidity resistance. Of the various possible candidates, silver requires a dielectric coating to prevent reaction between it and the mercury in the gas atmosphere of the display. This contributes to a higher fabrication cost. Fired aluminum compositions exhibit too high a resistivity and copper compositions require firing in an inert atmosphere. West German published application number 2,803,926 discloses an improved composition based on the addition of elemental silicon to an aluminum composition. Although the disclosed compositions give good properties when fired at 605° C. and above, no details are given for firing at 600° C. and below. Since planar gas discharge displays are generally fabricated using unsupported soda lime glass substrates, it is desirable to carry out the firing operation at temperatures less than 600° C. to prevent sagging of the substrate.

SUMMARY OF THE INVENTION

This invention provides copper-aluminum based compositions for producing conductor patterns on dielectric substrates. The compositions are air-fireable and are readily fired at temperatures compatible with the use of soda lime glass substrates. Such fired patterns exhibit low resistivity, excellent adhesion and good humidity resistance.

The metallization in the instant composition is based on the aluminum-copper binary system and comprises a mixture of aluminum powder, pre-reacted copper-aluminum powder in the form of a definite intermetallic phase ($CuAl_2$) and a glass frit. The low firing temperature used with this composition is a significant advantage since temperatures above 600° C. will cause unsupported float glass to warp and become distorted.

The air-fireable busbar compositions of this invention are pastes made from finely divided inorganic powders dispersed in an inert organic liquid vehicle. The inorganic powder is a material comprising 54 to 91 weight percent metal and 9 to 46 weight percent of a glass frit. The metal is a mixture of copper-aluminum powder and aluminum powder. The weight ratio is 1.4 to 1.8 parts by weight copper-aluminum powder to one part by weight aluminum powder.

The above composition is fired (sintered) on and adheres to a dielectric substrate such as glass, glass-ceramic and ceramic substrates. With respect to planar gas discharge display devices, there are two glass substrates having conductive patterns printed on one or both thereof in operative fashion. The cathode is typically nickel and the anode a conducting form of transparent tin oxide. Substrates are assembled such that a space filled with an ionizable gas separates them and defines the cavity or gap between the substrates. In the use of such devices an electric field is applied to various electrode segments causing ionization and production of light. Compositions of the present invention are used as busbars to the transparent tin oxide electrodes of such planar gas discharge display devices. These busbars are produced by printing and firing on the substrate a dispersion of one or more of the compositions of this invention.

DESCRIPTION OF THE PREFERRED EMBODIMENTS

Compositions of the present invention are finely divided powders dispersed in an inert organic liquid vehicle. The inorganic powder comprises a mixture of 54 to 91 weight percent of metal and 9 to 46 weight percent of a glass frit. The metal is a mixture of pre-reacted copper-aluminum powder and aluminum powder in a weight ratio of 1.4 to 1.8/1.

In one preferred embodiment the inorganic powder in the composition should comprise 72 to 86 weight percent solids. The balance should be organic components. Of the total solids the total metal should comprise 54 to 91 weight percent and the glass or frit 9 to 46 weight percent. An even more preferred range is 70 to 80 percent metal and 20 to 30 percent frit. For best results the copper-aluminum intermetallic phase/free aluminum ratio should be maintained at 1.4 to 1.8/1 with a still more preferred range from 1.55 to 1.65/1.

Although it is preferred that the composition of the fired metallization should correspond to the eutectic composition; i.e., 33.2 weight percent copper and 66.8 weight percent aluminum, it is found in practice that variations in composition from 25 to 40 percent copper and 60 to 75 percent aluminum exert only a very small effect on the efficacy of the metallization.

The compositions of the present invention will normally be fired at peak temperatures that range from about 560° to 600° C. in air for 5 to 15 minutes. While air firing is most convenient the compositions also can be fired in an inert atmosphere such as nitrogen or argon.

The compositions of this invention can be made by simply mixing the indicated amounts of copper-aluminum ($CuAl_2$) powder, aluminum powder and glass frit together. Alternatively these compositions can be formulated from a single metallic powder. Such a powder can be prepared by the atomization of a melt comprising copper and aluminum in a stoichiometry equivalent to that which is achieved following the printing and firing of any of the compositions of this invention.

Glass frits well known in the art are used in compositions of this invention. For specific application on busbars of DC gas discharge display systems it is preferred that the glass frits contain 10 to 85 weight percent of PbO or $Bi_2O_3$ or a mixture of PbO or $Bi_2O_3$; 1 to 20 percent by weight each of one or more of the following compounds: CdO, $SiO_2$, $B_2O_3$. One to 10 percent by weight each of one or more of the following compounds: $Na_2O$, $K_2O$, $Al_2O_3$, CaO, $TiO_2$, $Li_2O$ or ZnO can also be employed in some compositions.

All the inorganic powders used herein are finely divided; i.e., pass through a 400 mesh screen (less than 37 microns). However it is preferred that the particles have an average particle size of 10 microns or less. The inorganic particles are mixed with an inert liquid vehicle by mechanical mixing to form a paste-like composition. The paste-like composition is printed as thick film on conventional dielectric substrates. Examples of the organic liquids which can be used are the aliphatic alcohols; esters of such alcohols, for example, the acetates and propionates; terpenes such as pine oil, terpineol and the like; solutions of resins such as the polymethacrylates of lower alcohols or solutions of ethyl cellulose in solvents such as pine oil and the monobutyl ether of ethylene glycol monoacetate. The vehicle may contain or be composed of volatile liquids to promote fast setting after application to the substrate. Conventional binding agents such as the cellulosic type can be used to advantage.

The following examples in which all percents are by weight are provided for the purpose of further illustration.

EXAMPLE 1

A mixture comprising 53.5 percent copper and 46.5 percent aluminum was heated in an alumina crucible to a temperature of 950° C. and held at this temperature for one hour to ensure the formation of an homogeneous melt. To prevent excessive oxidation of the metal, a cover flux comprising 19 percent calcium chloride ($CaCl_2$), 13 percent sodium chloride (NaCl), 11 percent potassium chloride (KCl), 31.5 percent magnesium chloride ($MgCl_2$), 17 percent calcium fluoride ($CaF_2$) and 8.5 percent magnesium oxide (MgO) was maintained on the surface of the melt at all times. After the heating period, the crucible was removed from the melting furnace and allowed to cool to 700° C. before casting into a silica bowl.

When the solidified metal had cooled to room temperature it was brushed with a wire brush to remove scale and then washed in running water to remove any residual salts.

The material was dry crushed and ground to minus 48 mesh and then milled in isopropanol (water is not recommended) followed by air drying to yield a free flowing powder of less than 5 micrometers particle size. X-ray diffraction confirmed the formation of the copper-aluminum phase ($CuAl_2$). No evidence was found for the presence of free aluminum or copper.

A paste was formulated comprising 34.7 percent of the copper-aluminum powder made in the manner set forth above, 21.7 percent of five micrometers aluminum powder, 22.6 percent lead-borosilicate glass (78 percent PbO, 5.5 percent $SiO_2$, 12.5 percent $B_2O_3$, 4 percent $Al_2O_3$) 15 percent organic vehicle (10 percent ethyl cellulose and 90 percent terpineol) and 6 percent terpineol solvent. The paste was printed on samples of tin oxide coated and plain float glass. The following data were obtained:

| Firing Temperature (10 min.) | Resistivity-Milliohm/Sq/Mil | |
|---|---|---|
| | $SnO_2$-Coated Glass | Plain Glass |
| 570° C. | 132 | 125 |
| 580° C. | 58 | 49 |
| 590° C. | 42 | 45 |
| 600° C. | 32 | 37 |
| 610° C. | 33 | 28 |
| 620° C. | 29 | 32 |

No evidence of any staining on or around the tin oxide layer was observed. Furthermore, the material exhibited excellent adhesion characteristics and appeared compatible with the glass. Samples that were stored at 40' C. and 90 percent relative humidity for up to a six-week period after firing at 600° C. showed negligible deterioration in either resistivity or adhesion. The results are presented below.

| Sample # | Resistivity-Milliohm/Sq/Mil | | | |
|---|---|---|---|---|
| | Initial | 2 Weeks | 4 Weeks | 6 Weeks |
| 1 | 36 | 49 | 51 | 51 |
| 2 | 36 | 41 | 41 | 43 |
| 3 | 37 | 41 | 42 | 40 |
| 4 | 31 | 40 | 39 | 37 |
| 5 | 27 | 33 | 33 | 34 |

EXAMPLE 2

A mixture comprising 53.5 percent copper and 46.5 percent aluminum was heated in an alumina crucible to a temperature of 950° C. and held at this temperature for one hour to ensure the formation of a homogeneous melt. To prevent excessive oxidation of the metal, a cover flux comprising 19 percent calcium chloride ($CaCl_2$), 13 percent sodium chloride (NaCl), 11 percent potassium chloride (KCl), 31.5 percent magnesium chloride ($MgCl_2$), 17 percent calcium fluoride ($CaF_2$) and 8.5 percent magnesium oxide (MgO) was maintained on the surface of the melt at all times. After the heating period, the crucible was removed from the melting furnace and allowed to cool to 700° C. before casting into a silica bowl.

When the solidified metal had cooled to room temperature it was brushed with a wire brush to remove scale and then washed in running water to remove any residual salts.

The material was dry crushed and ground to minus 48 mesh and then milled in isopropanol (water is not recommended) followed by air drying to yield a free flowing powder of less than 5 micrometers particle size. X-ray diffraction confirmed the formation of the copper-aluminum phase ($CuAl_2$). No evidence was found for the presence of free aluminum or copper.

A paste was formulated comprising 36.3 percent copper-aluminum prepared as set forth above, 22.7 percent of 5 micrometer aluminum powder, 20 percent of a glass comprising 82 percent $Bi_2O_3$, 11 percent PbO, 3.5 percent $B_2O_3$, and 3.5 percent $SiO_2$, along with 15 percent organic vehicle (10 percent ethyl cellulose dissolved in terpineol) and 6 percent terpineol solvent. The paste was printed on samples of tin oxide coated and plain float glass. The following data were obtained:

| Firing Temperature (°C.) (15 min.) | Resistivity-Milliohm/Sq/Mil | |
|---|---|---|
| | $SnO_2$-Coated Glass | Plain Glass |
| 550 | 141 | 136 |
| 560 | 107 | 111 |
| 570 | 88 | 81 |
| 580 | 64 | 70 |
| 590 | 52 | 63 |
| 600 | 56 | 61 |
| 610 | 49 | 57 |
| 620 | 53 | 57 |

No evidence of any staining on or around the tin oxide layer was observed. Further, the material exhibited good adhesion characteristics and appeared compatible with the glass substrate. Samples that were tested at 40° C. and 90 percent relative humidity for up to a six-week period showed negligible deterioration in either resistivity or adhesion. Results are presented below for samples fired at 600° C.:

| Sample # | Resistivity-Milliohm/Sq/Mil | | | |
|---|---|---|---|---|
| | Initial | 2 Weeks | 4 Weeks | 6 Weeks |
| 1 | 59 | 77 | 84 | 79 |
| 2 | 72 | 83 | 96 | 92 |
| 3 | 63 | 60 | 74 | 77 |
| 4 | 49 | 53 | 79 | 73 |
| 5 | 54 | 71 | 82 | 85 |

EXAMPLE 3

A mixture comprising 53.5 percent copper and 46.5 percent aluminum was heated in an alumina crucible to a temperature of 950° C. and held at this temperature for one hour to ensure the formation of a homogeneous melt. To prevent excessive oxidation of the metal, a cover flux comprising 19 percent calcium chloride ($CaCl_2$), 13 percent sodium chloride (NaCl), 11 percent potassium chloride (KCl), 31.5 percent magnesium chloride ($MgCl_2$), 17 percent calcium fluoride ($CaF_2$) and 8.5 percent magnesium oxide (MgO) was maintained on the surface of the melt at all times. After the heating period, the crucible was removed from the melting furnace and allowed to cool to 700° C. before casting into a silica bowl.

When the solidified metal had cooled to room temperature it was brushed with a wire brush to remove scale and then washed in running water to remove any residual salts.

The material was dry crushed and ground to minus 48 mesh and then milled in isopropanol (water is not recommended) followed by air drying to yield a free flowing powder of less than 5 micometers in particle size. X-ray diffraction confirmed the formation of the copper-aluminum phase ($CuAl_2$). No evidence was found for the presence of free aluminum or copper.

A paste was formulated comprising 34.7 percent copper-aluminum powder prepared as set forth above, 21.7 percent of 5 micrometer aluminum powder, 22.6 percent of a glass comprising 54.2 percent$Bi_2O_3$, 18.5 percent $SiO_2$, 14.7 percent CdO, and 8.7 percent of $B_2O_3$, and 3.9 percent $Na_2O$ together with 15 percent organic vehicle (10 percent ethyl cellulose dissolved in terpineol) and 6 percent terpineol solvent. The paste was printed on samples of tin oxide coated and plain float glass. The following data were obtained.

| Firing Temperature (°C.) (15 min.) | Resistivity-Milliohm/Sq/Mil | |
|---|---|---|
| | $SnO_2$-Coated Glass | Plain Glass |
| 550 | High | High |
| 560 | 129 | 148 |
| 570 | 88 | 96 |
| 580 | 72 | 67 |
| 590 | 56 | 52 |
| 600 | 43 | 40 |
| 610 | 41 | 40 |
| 620 | 45 | 36 |

No evidence of any staining on or around the tin oxide layer was observed. Furthermore, the material exhibited very good adhesion characteristics and appeared compatible with glass substrates. Samples that were tested at 40° C. and 90 percent relative humidity for up to a six-week period after firing at 600° C. showed negligible deterioration in either resistivity or adhesion. The results are presented below.

| Sample # | Resistivity-Milliohm/Sq/Mil | | | |
|---|---|---|---|---|
| | Initial | 2 Weeks | 4 Weeks | 6 Weeks |
| 1 | 47 | 49 | 55 | 58 |
| 2 | 51 | 54 | 63 | 60 |
| 3 | 39 | 40 | 75 | 72 |
| 4 | 35 | 68 | 61 | 64 |
| 5 | 55 | 75 | 67 | 79 |

We claim:

1. Conductor compositions consisting essentially of finely divided inorganic powders dispersed in an inert organic liquid, said inorganic powders being 54 to 91 weight percent of metal and 9 to 46 weight percent of a glass frit, said metal being a mixture of an intermetallic phase of copper-aluminum powder/aluminum powder in a weight ratio of 1.4 to 1.8/1.

2. Conductor composition of claim 1 wherein 72 to 86 percent of the composition is finely divided inorganic powders and 14 to 28 weight percent is the organic liquid.

3. Conductor composition of claim 1 wherein 77 to 81 weight percent of the composition is the finely divided inorganic powder and 19 to 23 weight percent is the organic liquid.

4. Conductor composition of claim 1 wherein 70 to 80 weight percent of the inorganic powder is a metal and 20 to 30 weight percent is glass frit.

5. Conductor composition of claim 1 wherein the metal mixture is in a weight ratio of copper-aluminum powder/aluminum powder of 1.55 to 1.65/1.

6. Busbar conductor composition for use in DC gas discharge systems consisting essentially of finely divided inorganic powders dispersed in an inert organic liquid, said inorganic powders being 54 to 91 weight percent of metal and 9 to 46 weight percent of a glass frit, said metal being a mixture of an intermetallic phase of copper-aluminum powder/aluminum powder in a weight ratio of 1.4 to 1.8/1, said glass frit comprising 10 to 85 weight percent of a compound selected from the group consisting of PbO, $Bi_2O_3$ and mixtures thereof, and 1 to 20 percent by weight each of at least one compound selected from the group consisting of CdO, $SiO_2$ and $B_2O_3$.

7. The conductor composition of claim 6 wherein 72 to 86 weight percent of the composition is finely divided inorganic powders and 14 to 28 weight percent is the organic liquid.

8. The conductor composition of claim 6 wherein 77 to 81 weight percent of the composition is the finely divided inorganic powder and 19 to 23 weight percent is the organic liquid.

9. The conductor composition of claim 6 wherein 70 to 80 weight percent of the inorganic powder is a metal and 20 to 30 weight percent is glass.

10. The conductor composition of claim 6 wherein the metal mixture is in a weight ratio of copper-aluminum powder/aluminum powder of 1.55 to 1.65/1.

11. The conductor composition of claim 6 wherein the glass frit contains about 45 to 85 percent by weight PbO, 1 to 20 percent by weight $SiO_2$, 1 to 20 percent by weight $B_2O_3$ and 1 to 10 percent by weight $Al_2O_3$.

12. The conductor composition of claim 6 wherein the glass frit contains about 45 to 85 percent by weight $Bi_2O_3$, 1 to 20 percent by weight PbO, 1 to 20 percent by weight $B_2O_3$, and 1 to 10 percent by weight $SiO_2$.

13. The conductor composition of claim 6 wherein the glass frit contains about 45 to 85 percent by weight $Bi_2O_3$, 1 to 20 percent by weight $SiO_2$, 1 to 20 percent by weight CdO, 1 to 20 percent by weight $B_2O_3$, and 1 to 10 percent by weight $Na_2O$.

* * * * *